(12) United States Patent
Leung et al.

(10) Patent No.: US 7,292,456 B2
(45) Date of Patent: Nov. 6, 2007

(54) TECHNIQUES FOR CONTROLLING REMOVAL OF A CIRCUIT BOARD FROM A CHASSIS USING A BUTTON

(75) Inventors: Jimmy Leung, Fremont, CA (US); Mandy Lam, Fremont, CA (US); Toan Nguyen, San Jose, CA (US); Saeed Seyed, Los Altos Hills, CA (US); Michael Chern, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 14 days.

(21) Appl. No.: 11/274,024

(22) Filed: Nov. 15, 2005

(65) Prior Publication Data

US 2007/0109760 A1    May 17, 2007

(51) Int. Cl.
*H05K 7/12* (2006.01)
(52) U.S. Cl. .................. 361/798; 361/759; 361/754; 361/801; 361/747
(58) Field of Classification Search ................ 361/754, 361/798, 726, 732, 740, 741, 747, 756, 759, 361/801; 312/223.2, 223.3; 211/41.17
See application file for complete search history.

(56) References Cited

U.S. PATENT DOCUMENTS

| | | | |
|---|---|---|---|
| 6,172,880 B1 * | 1/2001 | Petitpierre et al. ......... | 361/801 |
| 6,373,713 B1 * | 4/2002 | Jensen et al. ............... | 361/759 |
| 6,388,884 B1 * | 5/2002 | Greco et al. ................ | 361/754 |
| 6,830,464 B1 | 12/2004 | Friend .......................... | 439/74 |
| 6,853,556 B1 | 2/2005 | Myers et al. ............... | 361/754 |
| 6,952,351 B1 | 10/2005 | Elg ............................. | 361/752 |
| 6,992,900 B1 * | 1/2006 | Suzue et al. ................ | 361/801 |
| 7,158,385 B1 * | 1/2007 | Wang .......................... | 361/759 |

* cited by examiner

*Primary Examiner*—Dean A. Reichard
*Assistant Examiner*—Dameon E. Levi
(74) *Attorney, Agent, or Firm*—BainwoodHuang (57) ABSTRACT

A control assembly controls removal of a circuit board from a chassis. The control assembly includes a support member configured to fasten to the circuit board, and a handle pivotally attached to the support member. The handle is configured to swing from an opened position to a closed position relative to the support member during installation of the circuit board within the chassis, and from the closed position to the opened position during removal of the circuit board from the chassis. The control assembly further includes a button configured to move between a biased position and a depressed position relative to the support member. The button is further configured to (i) inhibit removal of the circuit board from the chassis when the button is in the biased position, and (ii) enable removal of the circuit board from the chassis when the button is in the depressed position.

20 Claims, 10 Drawing Sheets

TECHNIQUES FOR CONTROLLING REMOVAL OF A CIRCUIT BOARD FROM A CHASSIS USING A BUTTON

BACKGROUND

Line cards which connect to backplanes typically include levers that, when rotated by technicians, enable the technicians to operatively connect the line cards with the backplanes, and disconnect the line cards from the backplanes. In particular, when a technician inserts a line card into a card cage and then rotates the levers of line card toward the card cage, the ends of the levers grab the card cage and evenly guide the line card into connection with a backplane at the back of the card cage. Furthermore, when the technician rotates the levers of line card away from the card cage, the ends of the levers push against the card cage and evenly disconnect the line card from the backplane.

It should be understood that a variety of movements in card cage environments have the potential to disconnect line cards from the backplanes. For example, vibration from fan assemblies can inadvertently dislodge a connected line card from a backplane over an extended period of operation. As another example, a technician who has opened a cabinet door or panel to provide servicing of another system component could accidentally actuate a lever and release a line card from its connected position within the card cage. In particular, a dangling sleeve, a stray cable or a fast moving limb could catch on a lever and inadvertently disengage the line card while the system is in operation.

To prevent line cards from inadvertently disconnecting from the backplane, some manufacturers equip their line cards with thumbscrews which are configured to thread into screw holes of the card cages. Along these lines, once a technician has properly connected such a line card to a backplane by closing the levers in a direction toward the card cage, the technician turns the thumbscrews of the line card in order to secure the line card to the card cage. As a result, any vibration or inadvertent actuation of a lever will not extract the line card from its installed position relative to the backplane.

SUMMARY

Unfortunately, the use of thumbscrews on line cards can be burdensome on a technician. For example, thumbscrews may be over-tightened during installation and thus require the technician to use a tool (e.g., a screwdriver) when removing a line card. Additionally, un-tightening thumbscrews is time-consuming and increases down time during servicing. Furthermore, the use of thumbscrews increases the burden on the technician during line card installation since the technician has to perform the added step of tightening the thumbscrews after the line card is already connected to the backplane.

In contrast to the above described line cards which employ thumbscrews, an improved control assembly controls removal of a circuit board from a chassis (e.g., a card cage) by employing a handle and a button (a single handle and a single button, two handles and two buttons, etc.). The handle facilitates proper insertion and extraction of the circuit board in a traditional manner. However, the button operates to either maintain locking of the circuit board (e.g., when the button is in a biased position) or permit unlocking of the circuit board (e.g., when the button is in a depressed position). Such operation allows for quick releasing of the circuit board from the chassis and alleviates the need for tightening or un-tightening thumbscrews. Accordingly, servicing of the circuit board by a user is simple and down time is minimized.

One embodiment is directed to a control assembly for controlling removal of a circuit board from a chassis. The control assembly includes a support member (e.g., a metallic tray) configured to fasten to the circuit board, and a handle pivotally attached to the support member. The handle is configured to swing from an opened position to a closed position relative to the support member during installation of the circuit board within the chassis, and from the closed position to the opened position during removal of the circuit board from the chassis. The control assembly further includes a button configured to move between a biased position and a depressed position relative to the support member. The button is further configured to (i) inhibit removal of the circuit board from the chassis when the support member is fastened to the circuit board and the button is in the biased (or non-depressed) position relative to the support member, and (ii) enable removal of the circuit board from the chassis when the support member is fastened to the circuit board and the button is in the depressed position relative to the support member.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved control assembly controls removal of a circuit board from a chassis (e.g., a card cage) by employing a handle and a button (a single handle and a single button, two handles and two buttons, etc.). The handle facilitates proper insertion and extraction of the circuit board in a traditional manner. The button operates to either maintain locking of the circuit board (e.g., when the button is in a biased position) or permit unlocking of the circuit board (e.g., when the button is in a depressed position). Such operation allows for quick releasing of the circuit board from the chassis and alleviates the need for tightening or un-tightening thumbscrews. As a result, disconnection of the circuit board from the chassis by a user is simple and down time is minimized.

Figure 1:
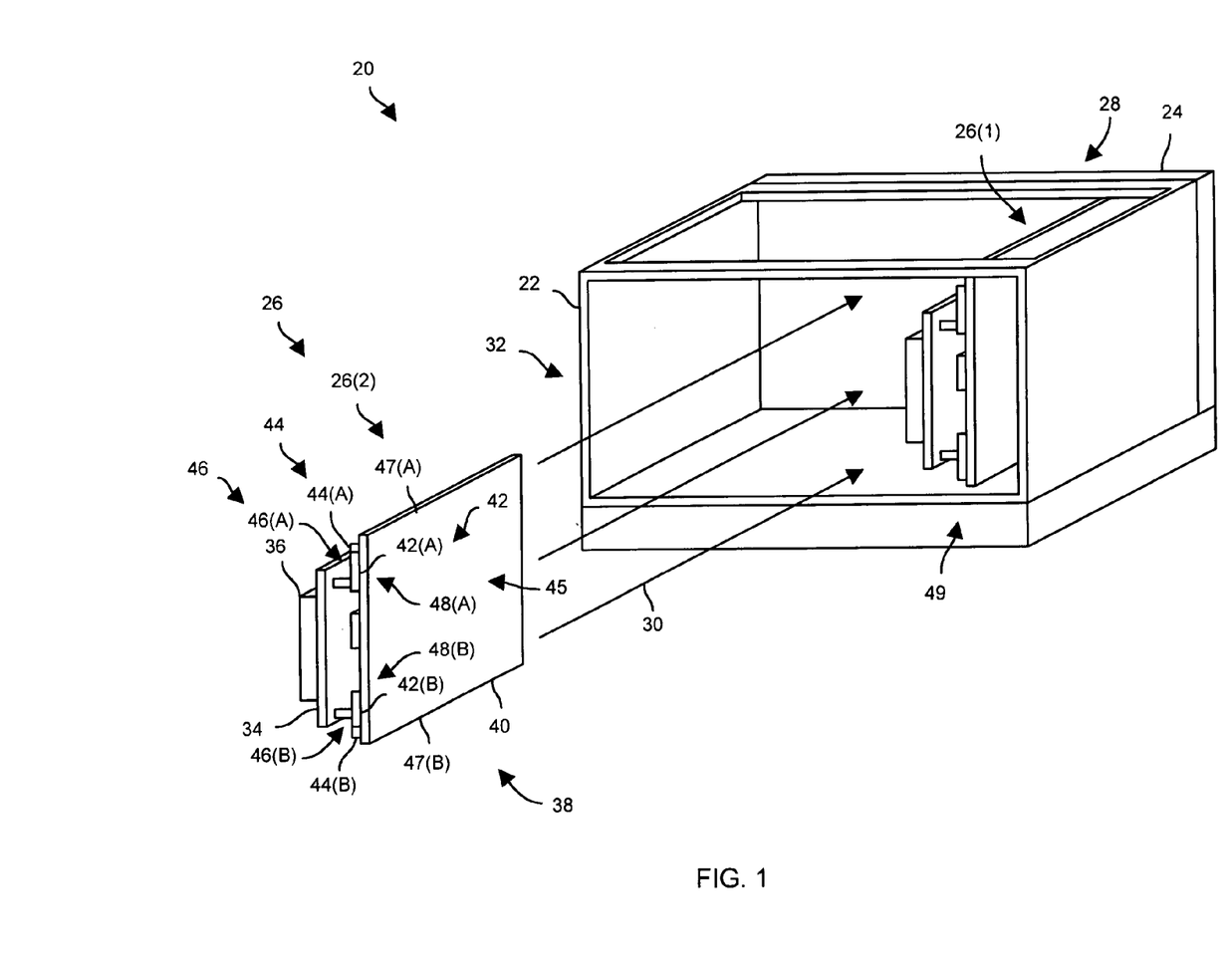
FIG. 1 is a perspective view of an electronic system having at least one circuit board module which utilizes a control assembly having a handle and a button.

FIG. 1 shows an electronic system 20 which employs an improved control assembly to manage removal of a circuit board from a chassis. As illustrated in FIG. 1, the electronic system 20 includes a chassis 22, a motherboard 24 (e.g., a backplane, a midplane, etc.) and a set of circuit board modules 26(1), 26(2), . . . , (collectively circuit boards modules 26). The motherboard 24 is disposed at a motherboard location 28 of the chassis 22 (e.g., a back end of the chassis 22 in the context of a backplane, a middle portion of the chassis 22 in the context of a midplane, etc). The circuit board modules 26 are configured to insert in a direction 30 through a circuit board location 32 (e.g., a front opening) of the chassis 22 and then connect with the motherboard 24.

Each circuit board module 26 (e.g., see the circuit board module 26(2) in FIG. 1) includes a circuit board 34, a set of circuit board devices 36 (e.g., integrated circuit devices, discrete components, connectors, heat sinks, etc.) mounted to the circuit board 34, and a control assembly 38 mounted to the circuit board 34. The control assembly 38 includes a support member 40 fastened to the circuit board 34, a set of handles 42(A), 42(B) (collectively, handles 42) and a set of button subassemblies 44(A), 44(B) (collectively, button subassemblies 44).

In some arrangements, the support member 40 is a metallic tray and hardware which operate as an electromagnetic barrier or shield between the circuit board 34 and another circuit board 34 belonging to another circuit board module 26 (e.g., a circuit board 34 of an adjacent circuit board module 26). In these arrangements, the metallic tray has a central portion 45 configured to fasten to the circuit board 34, a first edge 47(A) which is configured to engage a first module guide of the chassis 22, and a second edge 47(B) which is configured to engage a second module guide of the chassis 22. The module guides (e.g., slots) are illustrated generally by the arrow 49 in FIG. 1 for simplicity.

The handles 42 of the control assembly 38 are pivotally attached to the support member 40. As such, each handle 42 is configured to swing from an opened position to a closed position relative to the support member 40 during installation of a circuit board 34 within the chassis 22. At this time, the ends of each handle 42 is configured to grip onto to chassis 22 in a traditional manner to apply even insertion force for reliable mating of the circuit board 34 with the motherboard 24.

As will be explained in further detail shortly, a user must actuate the button subassemblies 44 prior to removal of the circuit board 34 from the motherboard 24. Following such actuation, each handle 42 is configured to move from the closed position back to the opened position. As this occurs, the ends of each handle 42 presses against portions of the chassis 22 in a traditional manner to apply even extraction force for reliable de-mating of the circuit board 34 from the motherboard 24.

Each button subassembly 44 of the control assembly 38 is configured to move between a biased (or non-depressed) position and a depressed position relative to the support member 40. Each button subassembly 44 is further configured to (i) inhibit removal of the circuit board 34 from the chassis 22 when the button subassembly 44 is in the biased position relative to the support member 40, and (ii) enable removal of the circuit board 34 from the chassis 22 when the button subassembly 44 is in the depressed position relative to the support member 34.

The handle 42(A) and the button subassembly 44(A) form a first handle/button subsystem 46(A) disposed at a top section 48(A) of the circuit board module 26. Similarly, the handle 42(B) and the button subassembly 44(B) form another handle/button subsystem 46(B) disposed at a bottom section 48(B) of the circuit board module 26. A user is capable of operating the handle/button subsystems 46(A), 46(B) (collectively, handle/button subsystems 46) together to apply smooth and uniform insertion force during module connection with the motherboard 24, and smooth and uniform extraction force module disconnection from the motherboard 24. Moreover, the placements of the button subassemblies 44 relative to the handles 42 provide advantageous ergonomic benefits such as the ability for the user to simultaneously depress a button subassembly 44 while gripping and moving the handle 42 of that subsystem 46 with a single hand thus enabling convenient actuation.

It should be understood that the button subassemblies 44 operate to either maintain locking of a circuit board 34 (e.g., when the button subassemblies 44 are in biased positions) or unlocking of the circuit board 34 (e.g., when the button subassemblies 44 are in depressed positions). Such operation allows for quick releasing of the circuit board 34 from the chassis 22 and alleviates the need for tightening or un-tightening thumbscrews. Accordingly, servicing of the circuit board module 26 by a user is simple and down time is minimized.

Nevertheless, it should be further understood that nothing precludes the use of thumbscrews on each circuit board module 26. Rather, thumbscrews can be made available on the control assembly 38 of each circuit board module 26 as a failsafe precaution for users who are more comfortable using thumbscrews. Further details of the control assembly 38, e.g., the ability of the control assembly 38 to control removal of the circuit board 34 from the chassis 22 will now be discussed in with reference to the other figures.

Figure 2:
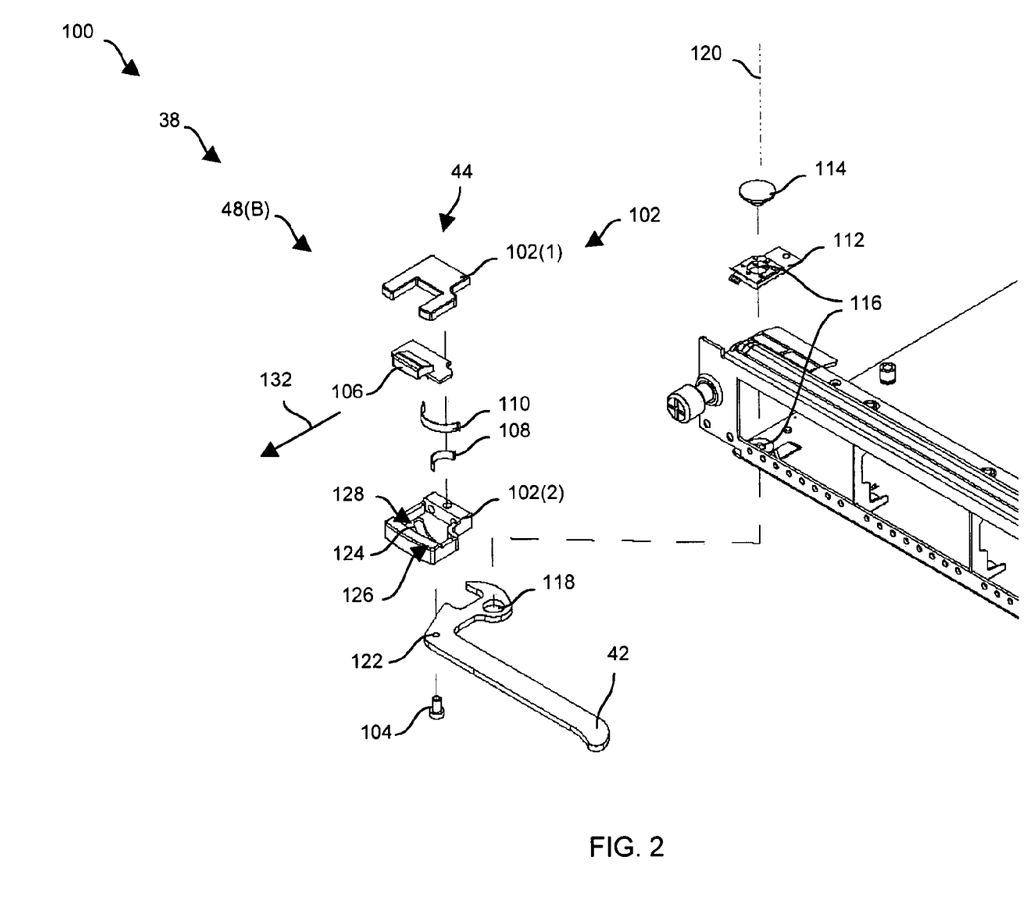
FIG. 2 is an exploded view of a section of a first control assembly embodiment which employs a pin to selectively block and allow actuation of the handle.
Figure 3:
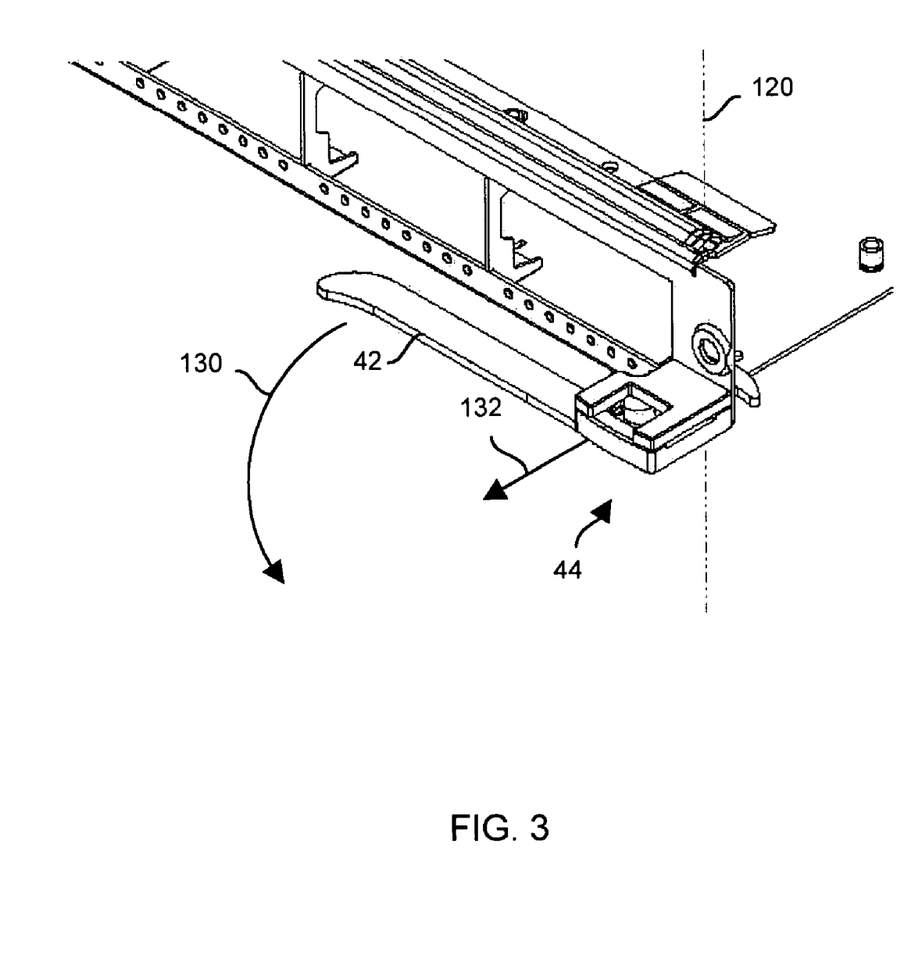
FIG. 3 is a perspective view of a similar section of the first control assembly embodiment of FIG. 2.

FIGS. 2 and 3 show detailed views of a first embodiment 100 of the control assembly 38. FIG. 2 is an exploded view of the bottom section 48(B) of the control assembly 38 in accordance with the first embodiment 100. FIG. 3 is an assembled view of the top section 48(A) of the control assembly 38 in accordance with the first embodiment 100. It should be understood that the bottom section 48(B) and the top section 48(A) (collectively, sections 48) are preferably configured as mirror images of each other. Accordingly, it should be understood that a detailed explanation of one section 48 applies to the other section 48.

As shown in FIG. 2, each button subassembly 44 of the control assembly 38 includes mounting portions 102(1), 102(2) (collectively, mounting portions 102), a pin 104, a button 106, a pin biasing spring 108, a button biasing spring 110, a fastener 112 and a screw 114. The mounting portions 102, in combination with the fastener 112 and the screw 114, are configured to pivotally mount the handle 42 to the support member 40. In particular, the fastener 112 and the support member 40 define threaded screw holes 116 into which the screw 114 fastens. Additionally, the handle 42 defines an aperture 118 through which the screw 114 passes thus enabling the handle to rotate about an axis 120 defined by the screw 114 (also see FIG. 3).

As further shown in FIG. 2, the mounting portions 102 are further configured to hold the pin 104, the button 106 and the springs 108, 110 in operational positions. In particular, the pin 104 (i) passes through a pin hole 122 defined by the handle 42, and (ii) is capable of sliding along an arc-shaped slot 124 defined by the mounting portions 102 when the button 108 is not obstructing the pin 104. The pin biasing spring 108 is configured to urge the pin away from a first end 126 of the slot 124 and toward a second end 128 of the slot 124 thus rotationally biasing the handle 42 to from a closed position (as shown in FIG. 3) to an opened position relative to the support member 40 (e.g., see the arrow 130 in FIG. 3). The button biasing spring 108 is configured to urge the button 106 in a direction 132 away from the support member 40 (e.g., see both FIGS. 2 and 3). It should be noted that the direction 132 is substantially parallel to an installation axis of the circuit board module 26, i.e., see the installation direction 30 in FIG. 1.

During operation, the spring 108, which is disposed between the between the button 106 and the support member 40, biases the button 106 into a biased position away from the support member 40 (e.g., see FIG. 3). While the button 106 is in the biased position, the button 106 prevents a user from moving rotating the handle 42. In particular, the button 106 provides interference which prevents the pin 104 (which holds the handle 42 in position relative to the support member 40) from moving out of the end 126 of the slot 124. Accordingly, the end 126 of the slot 124 is essentially a handle locking position since the pin 104 is trapped and thus locks the handle 42 in place. Specifically, the pin 104, which is held in place within the slot 124 by the button 106, obstructs rotational movement of the handle 42 thus reliably maintaining the support member 40 (and the circuit board 34 attached thereto) within the chassis 22.

However, when the user overcomes the spring force of the button biasing spring 110 by pushing the button 106 toward the support member 40 (i.e., the direction opposite the direction 132), the button 106 no longer provides interference against the pin 104. Accordingly, the pin biasing spring 108 moves the pin 104 along the slot 124 toward the opposite end 128, i.e., the pin 104 is no longer hindered by the button 106 while the button 106 is depressed. As a result, the end of the handle 42 pivots away from the support member 40. Hence, the end 128 of the slot 124 is essentially a handle unlocking position. Preferably, the user actuates both button subassemblies 44 in this manner simultaneously to evenly remove the circuit board 34 held by the support member 40 from the chassis 22, i.e., a direction opposite the installation axis 30 in FIG. 1. Details of a second embodiment will now be provided with reference to FIGS. 4 through 7.

Figure 4:
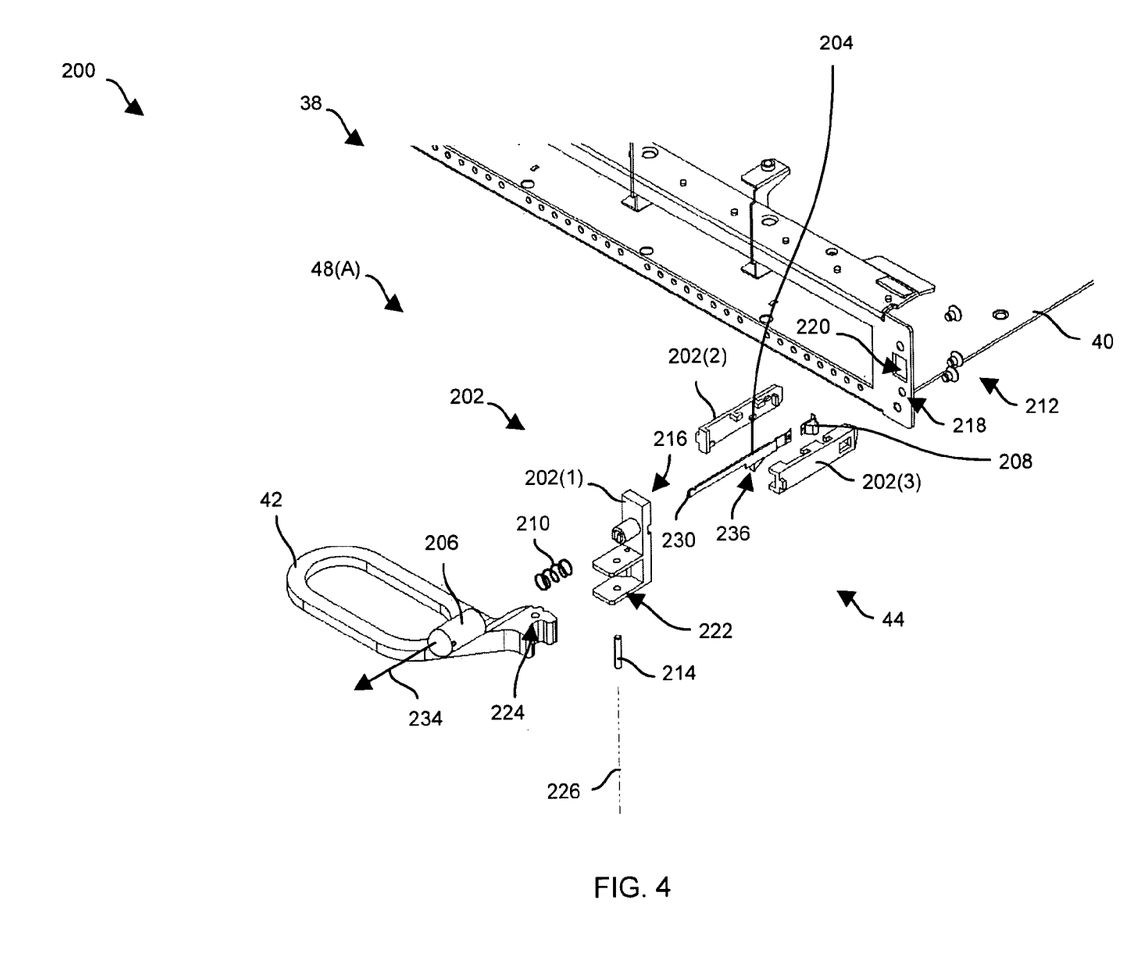
FIG. 4 is an exploded view of a section of a second control assembly embodiment which employs a latching spring to selectively impede or permit removal of the circuit board.
Figure 5:
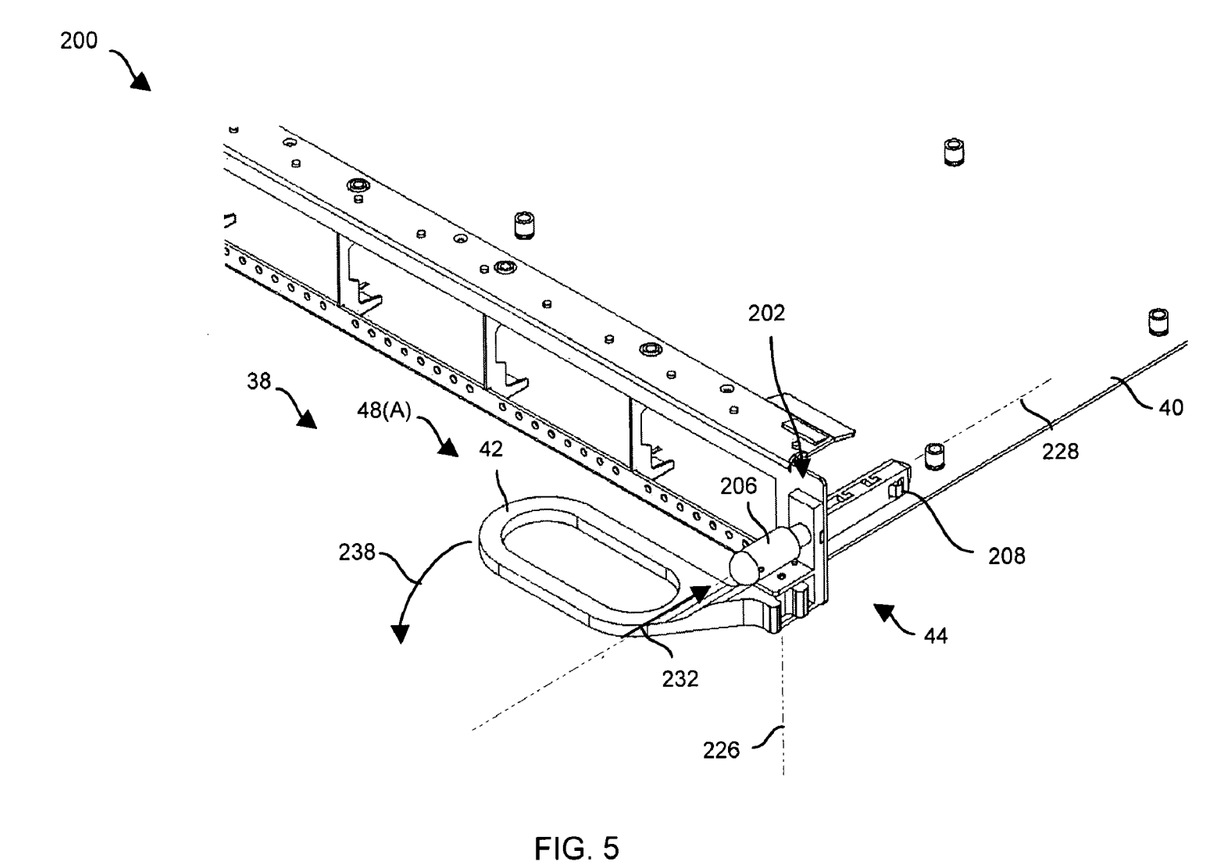
FIG. 5 is a perspective view of the section of the second control assembly embodiment of FIG. 4.
Figure 6:
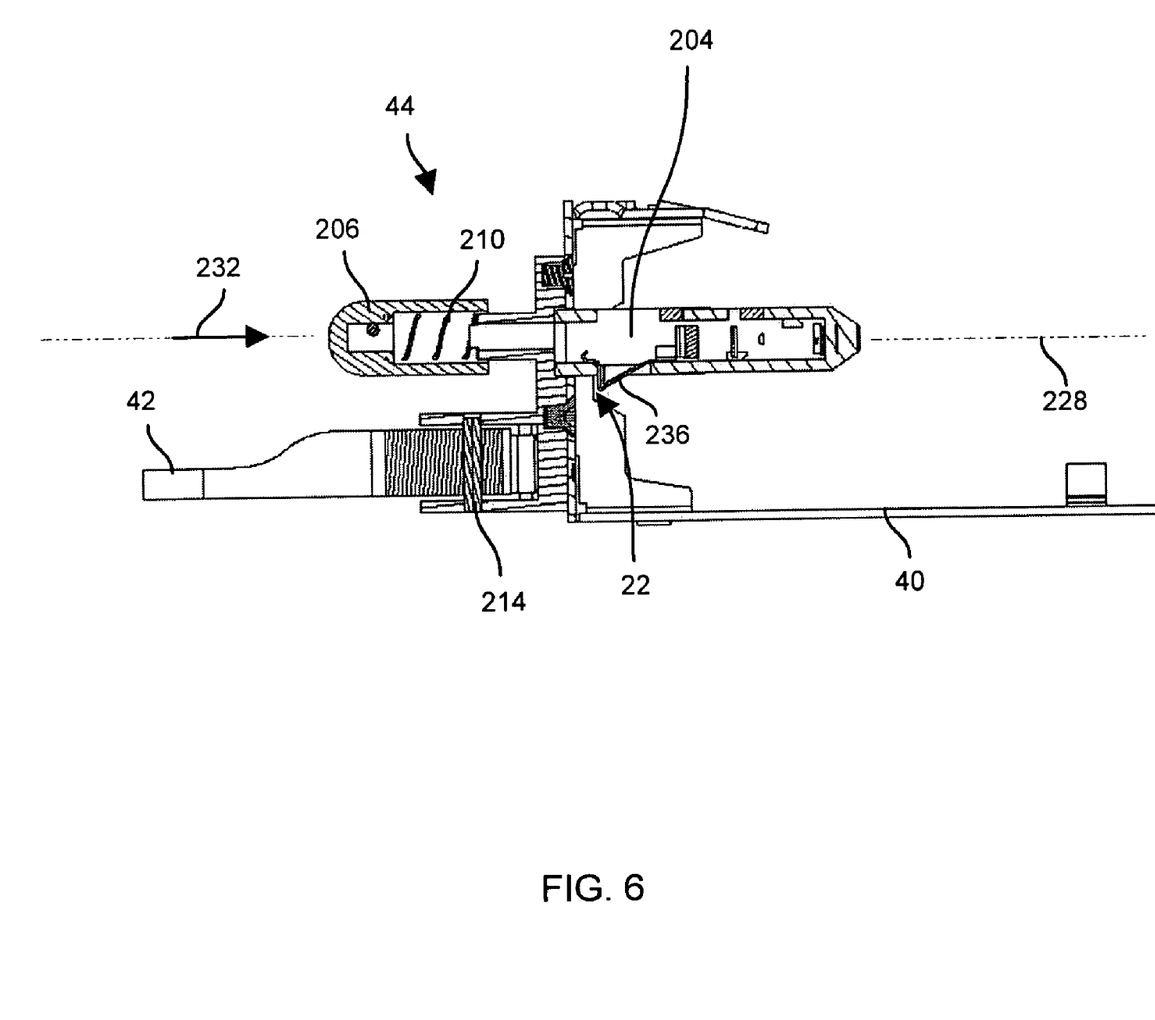
FIG. 6 is a cross-sectional view of the section of the second control assembly embodiment of FIGS. 4 and 5 when the button is in a biased position.
Figure 7:
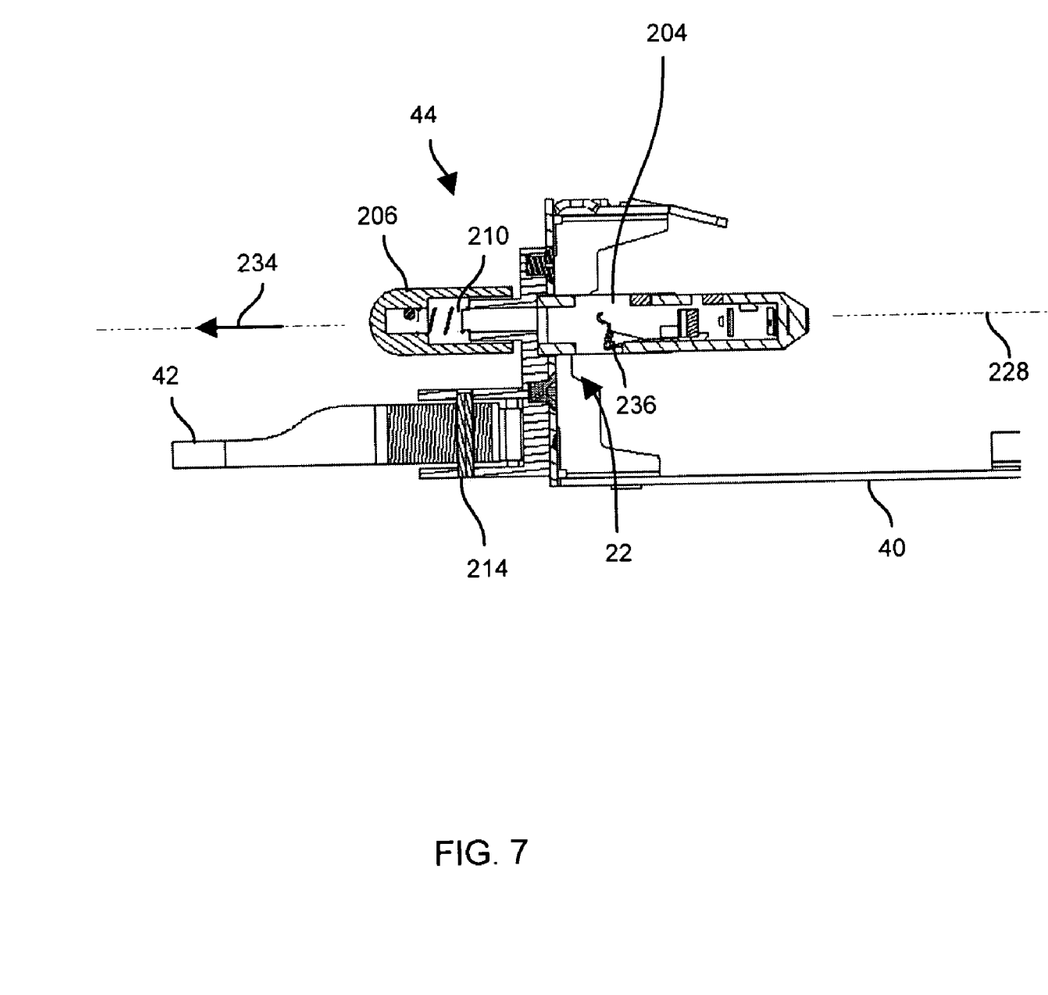
FIG. 7 is a cross-sectional view of the section of the second control assembly embodiment of FIGS. 4 and 5 when the button is in a depressed position.

FIGS. 4 through 7 show detailed views of a second embodiment 200 of the control assembly 38. FIG. 4 is an exploded view of the top section 48(A) of the control assembly 38 in accordance with the second embodiment 200. FIG. 5 is an assembled view of the top section 48(A) of the control assembly 38 in accordance with the second embodiment 200. FIGS. 6 and 7 are cross-sectional side views of the top section 48(A) of the control assembly 38 at various stages of operation. It should be understood that the top section 48(A) and the bottom section 48(B) are preferably configured as mirror images of each other. Accordingly, it should be understood that a detailed explanation of one section 48 applies to the other section 48.

As shown in FIG. 4, each button subassembly 44 of the control assembly 38 includes mounting portions 202(1), 202(2), 202(3) (collectively, mounting portions 202), a latching spring 204, a button 206, a supplemental spring 208, a button biasing spring 210, screws 212 and a post 214. The mounting portions 202, in combination with the screws 212, are configured to attach the handle 42 to the support member 40. In particular, the mounting portion 202(1) defines screw holes 216 (shown generally by the arrow 216 in FIG. 4) into which the screws 212 tap into, and the support member 40 defines apertures 218 through which the screws 212 pass in order to secure the handle 42 to the support member 40. The support member 40 further defines another aperture 220 through which the mounting portions 202(2), 202(3) and the latching spring 204 pass.

As further shown in FIG. 2, the mounting portion 202(1) further defines post holes 222, and the handle defines a post hole 224 to receive the post 214. Accordingly, the handle 42 is capable of rotating about an axis 226 defined by the post 214 (also see FIG. 5).

It should be understood that the mounting portions 202 are further configured to hold the latching spring 204, the button 206, the supplemental spring 208, and the button biasing spring 210 in operational positions. In particular, the latching spring 204 is capable of sliding along a button axis 228 (FIG. 5) which is substantially parallel to the installation axis 30 (also see FIG. 1) in response to movement of the button 206. Along these lines, an end 230 of the latching spring 204 abuts the button 206. Accordingly, movement of the button 206 toward the support member 40 (see the arrow 232 in FIG. 5) results in movement of the latching spring 204 in the same direction.

It should be further understood that the supplemental spring 208 is a leaf spring which is configured to bias the latching spring 204 toward the button 206. Furthermore, the button biasing spring 210 is a coil spring which is configured to urge the button 206 away from the support member 40, e.g., see the arrow 234 in FIG. 4 which is opposite to the button depression direction 232 (FIG. 5). The directions 232, 234 are substantially parallel to the installation axis 30 (see FIG. 1).

During operation, the button biasing spring 210 biases the button 206 into a biased position away from the support member 40 (e.g., the direction 234 of FIG. 4). While the button 206 is in the biased position, an obstructing portion 236 of the latching spring 204 provides interference against part of the chassis 22 (also see FIG. 1) which prevents a user from removing support member 40 from the chassis 22. The interference between the obstructing portion 236 of the latching spring 204 and the chassis 22 is clearly shown in FIG. 6. Accordingly, the latching spring 204 is essentially at a chassis locking position while the button 206 is not depressed.

However, when the user overcomes the spring forces of the button biasing spring 210, the supplemental spring 208 and the latching spring 204 by pushing the button 206 toward the support member 40 (i.e., the direction 232), the obstructing portion 236 of the latching spring 204 no longer provides interference against the chassis 22. Hence, the latching spring 204 is now in a chassis unlocking position which allows removal of the support member 40 from the chassis 22. That is, the button 206 pushes the latching spring 204 toward the supplemental spring 208 resulting in movement of the obstructing portion 236 out of the way so that the obstructing portion 234 no longer hinders removal of the support member 40 from the chassis 22. The absence of interference between the obstructing portion 236 of the latching spring 204 and the chassis 22 is clearly shown in FIG. 7. Accordingly, the user can now pivot the end of the handle 42 away from the support member 40 (see the arrow 238 in FIG. 5). Preferably, the user actuates both button subassemblies 44 in this manner simultaneously to evenly remove the circuit board 34 held by the support member 40 from the chassis 22, i.e., the user moves the support member 40 in the direction 234 opposite the installation axis 30 in FIG. 1. Details of a third embodiment will now be provided with reference to FIGS. 8 through 10.

Figure 8:
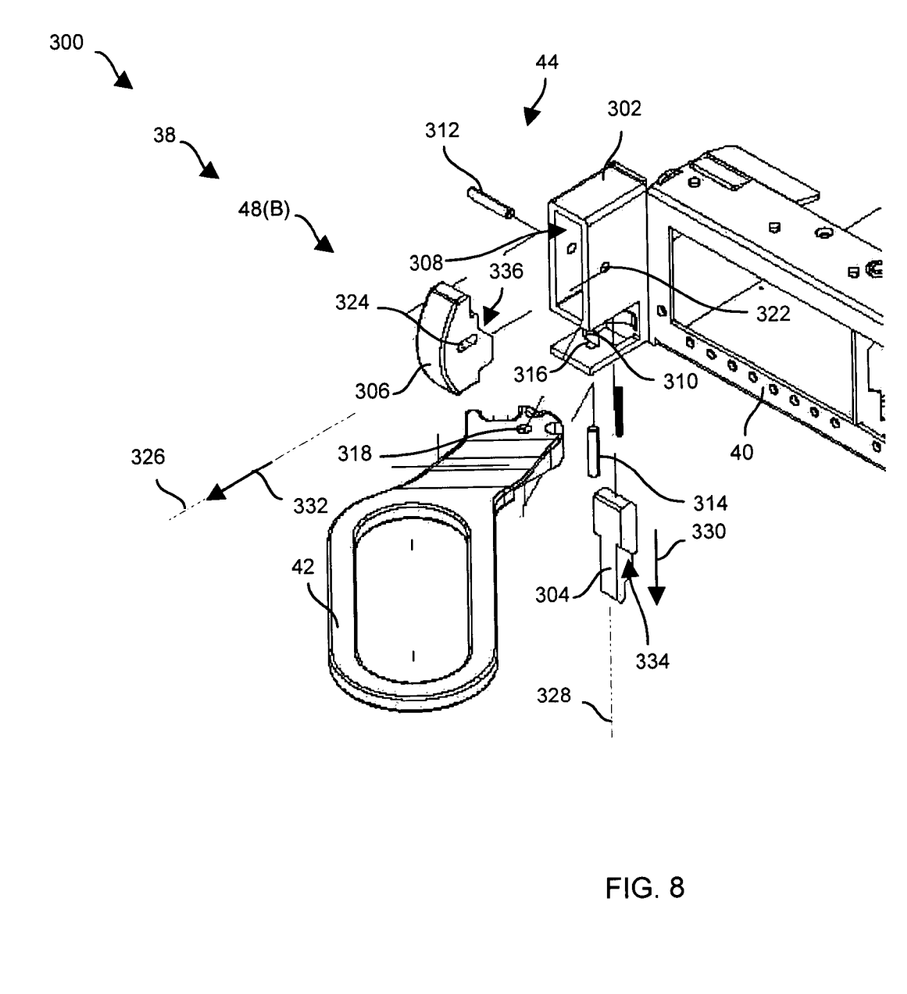
FIG. 8 is an exploded view of a section of a third control assembly embodiment which employs a tab to selectively block and allow actuation of the handle.
Figure 9:
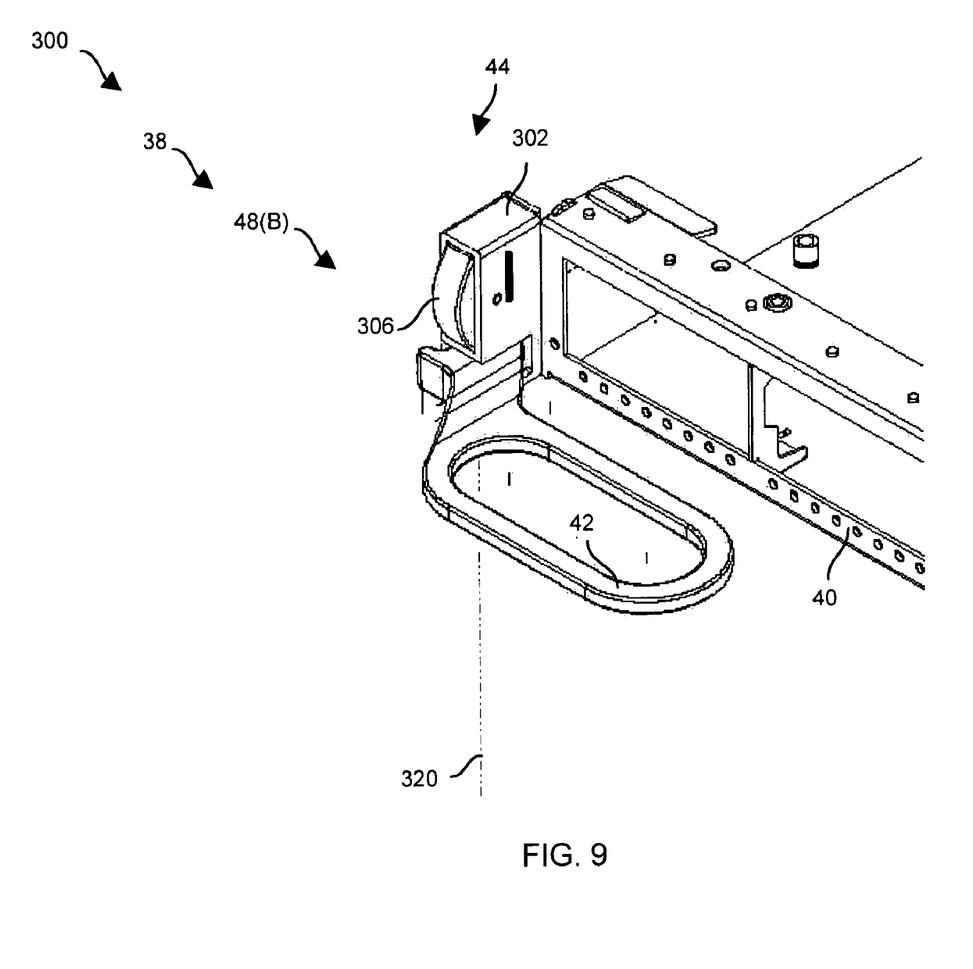
FIG. 9 is a perspective view of the section of the third control assembly embodiment of FIG. 8 when the handle is in a closed position.
Figure 10:
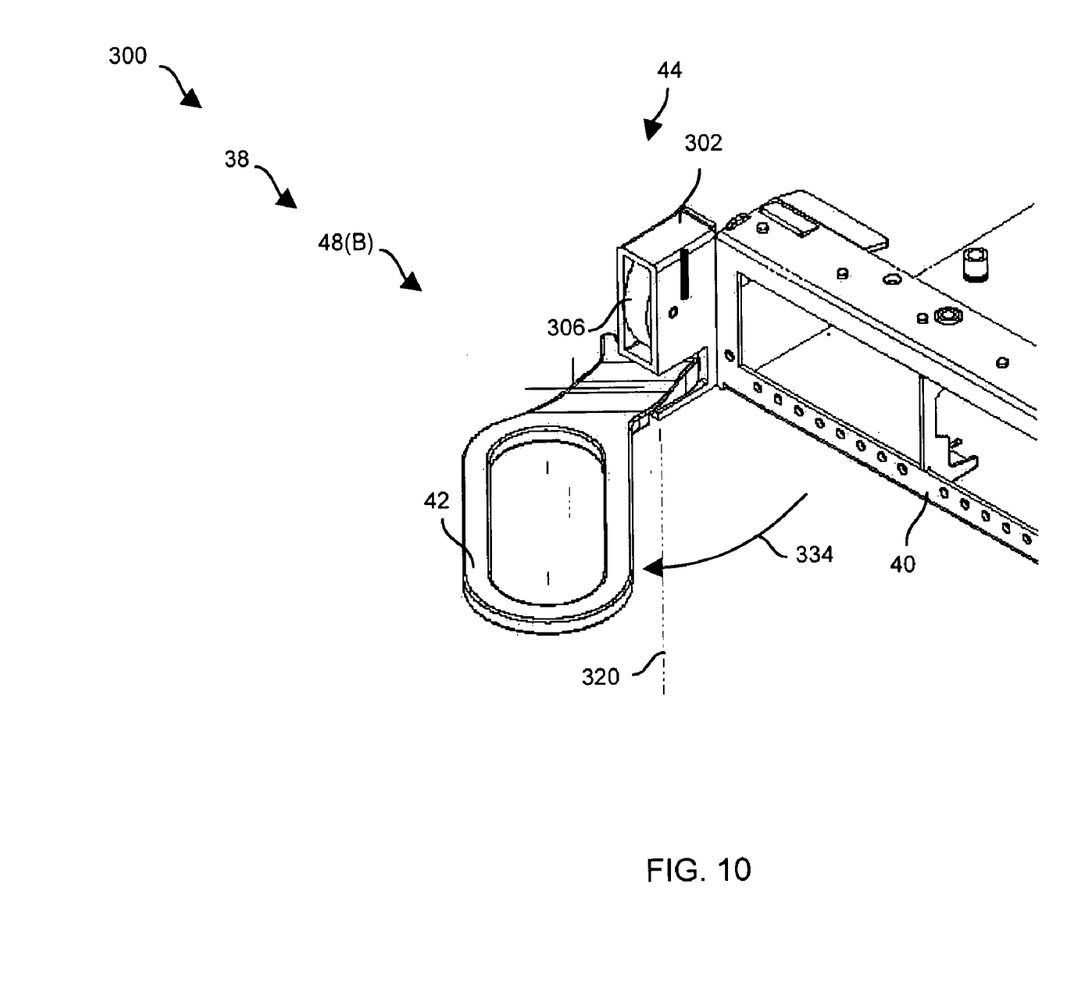
FIG. 10 is a perspective view of the section of the third control assembly embodiment of FIG. 8 when the handle is in an opened position.

FIGS. 8 through 10 show detailed views of a third embodiment 300 of the control assembly 38. FIG. 8 is an exploded view of the bottom section 48(B) of the control assembly 38 in accordance with the third embodiment 300. FIG. 9 is an assembled view of the bottom section 48(B) in a closed position in accordance with the third embodiment 300. FIG. 10 is an assembled view of the bottom section 48(B) in an opened position. It should be understood that the bottom section 48(B) and the top section 48(A) (collectively, sections 48) are preferably configured as mirror images of each other. Therefore, it should be understood that a detailed explanation of one section 48 applies to the other section 48.

As shown in FIG. 8, each button subassembly 44 of the control assembly 38 includes a mounting portion 302, a tab 304, a button 306, two tab biasing springs 308, 310 (one is shown generally by the arrow 308 in FIG. 8), a button post 312 and a handle post 314. The mounting portion 302, in combination with the handle post 314, is configured to pivotally mount the handle 42 to the support member 40. In particular, mounting portion 302 defines holes 316 for capturing the handle post 314. Additionally, the handle 42 defines an aperture 318 through which the handle post 314 passes thus enabling the handle 42 to rotate about an axis 320 defined by the handle post 314 (also see FIG. 9).

As further shown in FIG. 8, the mounting portion 302 is further configured to hold the tab 304, the button 306 and the springs 308, 310 in operational positions. In particular, the mounting portion 302 further defines holes 322, and the button 306 defines an elongated slot 324. The button post 312 is captured within the holes 322 defined by the mounting portion 302. Movement of the button 306 is controlled by the button post 314 which passes through the elongated slot 324 defined by the button 306 and by the sides of the mounting portion 302. That is, the button 306 is thus capable of moving along a button axis 326 toward and away from the support member 40.

Furthermore, the tab 304 is capable of sliding along a tab axis 328 (FIG. 8) which is substantially parallel the axis 320 defined by the handle post 314 (FIG. 9). The tab biasing spring 308 is configured to urge the tab in a downward direction 330 along the tab axis 328 (see the arrow 330 in FIG. 8) and the tab biasing spring 310 is configured to concurrently urge the button 306 in an outward direction away from the support member 40 along the button axis 326, i.e., in a direction 332 (see the arrow 332 in FIG. 8) substantially opposite the installation axis 30 (FIG. 1).

During operation, ramped surfaces 334 of the tab 304 slide along corresponding ramped surfaces 336 of the button 306. Accordingly, while the button 306 is in the biased position, the tab 304 resides in a handle locking position that prevents a user from moving rotating the handle 42. In particular, the tab 304 provides interference which prevents the handle 42 from moving out of the closed position (see FIG. 9). As a result of such obstruction, the control assembly 38 reliably maintains the support member 40 (and the circuit board 34 attached thereto) within the chassis 22.

However, when the user overcomes the spring force of the springs 308, 310 by pushing the button 306 toward the support member 40 (i.e., the direction opposite the direction 132), the tab 304 moves upward along the axis 328 (i.e., away from the handle 42) and no longer provides interference. In particular, the ramped surfaces 334, 336 interact to move the tab 304 in the direction opposite the arrow 330. At this point, the tab 304 is in a handle unlocking position since the handle 42 is now capable of rotating about the axis 320. That is, the tab 304 no longer hinders the handle 42 while the button 306 is depressed, and the user is capable of (i) pivoting the end of the handle 42 away from the support member 40 to the opened position (see the arrow 334 in FIG. 10) and thus (ii) extracting the support member 40 from the chassis 22. Preferably, the user actuates both button subassemblies 44 in this manner simultaneously to evenly remove the circuit board 34 held by the support member 40 from the chassis 22, i.e., a direction opposite the installation axis 30 in FIG. 1.

As mentioned above, an improved control assembly 38 controls removal of a circuit board 34 from a chassis 22 (e.g., a card cage) by employing a handle 42 and a button 106, 206, 306. The handle 42 facilitates proper insertion and extraction of the circuit board 34 in a traditional manner. The button 106, 206, 306 operates to either maintain locking of the circuit board 34 (e.g., when the button is in a biased position) or permit unlocking of the circuit board 34 (e.g., when the button is in a depressed position). Such operation allows for quick releasing of the circuit board 34 from the chassis 22 and alleviates the need for tightening or untightening thumbscrews. Accordingly, servicing of the circuit board 34 by a user is simple and down time is minimized.

While this invention has been particularly shown and described with references to preferred embodiments thereof, it will be understood by those skilled in the art that various changes in form and details may be made therein without departing from the spirit and scope of the invention as defined by the appended claims.

For example, as mentioned earlier, nothing precludes the use of thumbscrews on each circuit board module 26 (e.g., see FIG. 2). Rather, thumbscrews can be made available on the control assembly 38 of each circuit board module 26 as a failsafe precaution for users who are more comfortable using thumbscrews.

What is claimed is:

1. A control assembly for controlling removal of a circuit board from a chassis, the control assembly comprising:

a support member constructed and arranged to fasten to the circuit board;

a handle pivotally attached to the support member, so as to allow the handle to swing from an opened position to a closed position relative to the support member during installation of the circuit board within the chassis, and from the closed position to the opened position during removal of the circuit board from the chassis;

a button operatively connected to the handle and moveable between a biased position and, a depressed position relative to the support member, the button (i) inhibiting removal of the circuit board from the chassis when the support member is fastened to the circuit board and the button is in the biased position relative to the support member by preventing pivoting of the handle, and (ii) enabling removal of the circuit board from the chassis when the support member is fastened to the circuit board and the button is in the depressed position relative to the support member by allowing pivoting of the handle:
  a mounting portion constructed and arranged to engage the button and the handle, the mounting portion including a slot having a first end and a second end disposed therein;
  a pin disposed within the handle and the slot, the pin being moveable within the slot from a first position within the slot to a second position within the slot to allow pivotal movement of the handle from a closed to an open position; and
  wherein the biased position of the button retains the pin in the first position and prevents movement of the pin to the second position within the slot so as to prevent pivotal movement of the handle, the pin being moveable to the second position within the slot upon depression of the button so as to allow pivotal movement of the handle.

2. A control assembly as recited in claim 1, further comprising:
  a spring disposed between the button and a portion of the support member, the spring biasing the button into the biased position and enabling movement of the button from the biased position to the depressed position in response to a compression force which overcomes an opposite spring force provided to the button by the spring.

3. A control assembly as recited in claim 2 wherein the circuit board is configured to slide into and out of the chassis along a circuit board installation axis; and wherein the button is constructed and arranged to move from the biased position to the depressed position with the compression force applied along a button axis which is substantially parallel to the circuit board installation axis.

4. A control assembly as recited in claim 2 wherein the button defines a set of ramped surfaces which is configured to slide the pin from the handle closed position to the handle opened position during depression of the button along the button axis.

5. A control assembly as recited in claim 1 wherein the support member includes:
  a metallic tray having a central portion configured to fasten to the circuit board, a first edge which is configured to engage a first guide of the chassis, and a second edge which is configured to engage a second guide of the chassis, the metallic tray being configured to hold the circuit board within the chassis when the first edge and the second edge are engaged with the chassis.

6. A control assembly as recited in claim 5 wherein the metallic tray is configured to operate as an electromagnetic interference barrier which shields a side of the circuit board when the central portion of the metallic tray fastens to the circuit board.

7. A control assembly as recited in claim 1, wherein the slot has an arcuate shape.

8. A control assembly as recited in claim 2, further comprising a pin biasing spring disposed within the mounting portion, the pin biasing spring urging the pin away from the first position within the slot toward the second position within the slot so as to enable rotational movement of the handle from the closed to open position upon depression of the button.

9. A control assembly for controlling removal of a circuit board from a chassis, the control assembly comprising:
  a support member constructed and arranged to fasten to the circuit board;
  a handle pivotally attached to the support member so as to allow the handle to swing from an opened position to a closed position relative to the support member during installation of the circuit board within the chassis, and from the closed position to the opened position during removal of the circuit board from the chassis;
  a button operatively connected to the handle and moveable between a biased position and a depressed position relative to the support member, the button (i) inhibiting removal of the circuit board from the chassis when the support member is fastened to the circuit board and the button is in the biased position relative to the support member by preventing pivoting of the handle, and (ii) enabling removal of the circuit board from the chassis when the support member is fastened to the circuit board and the button is in the depressed position relative to the support member by allowing pivoting of the handle;
  a latching spring having a first end which abuts the button, a second end opposite the first end, and an interference portion which abuts a section of the chassis when the latching spring is in a locked position, and which is spaced from the chassis when the latching spring is in an unlocked position; and
  wherein the biased position of the button retains the latching spring in the locked position such that the interference portion abuts the chassis and prevents pivotal movement of the handle and wherein upon depression of the button the latching spring is moved into the unlocked position such that the interference portion is spaced from the chassis and the handle is able to pivot.

10. A control assembly as recited in claim 9 wherein the circuit board is configured to slide into and out of the chassis along a circuit board installation axis; and wherein the button is constructed and arranged to move from the biased position to the depressed position with the compression force applied along a button axis which is substantially parallel to the circuit board installation axis.

11. A control assembly as recited in claim 10 further comprising a mounting portion, the mounting portion constructed and arranged to support the latching spring and allow movement of the latching spring along the button axis between the locked position and the unlocked position in response to depression of the button.

12. A control assembly as recited in claim 11 further comprising:
  a button biasing spring disposed between the button and the mounting portion, the button biasing spring biasing the button into the biased position and enabling movement of the button from the biased position to the depressed position in response to a compression force which overcomes an opposite spring force provided to the button by the button biasing spring.

13. A control assembly as recited in claim 12 further comprising:
  a supplemental spring supported by the mounting portion, the supplemental spring biasing the latching spring toward the button.

14. A control assembly as recited in claim 9 wherein the support member includes:
  a metallic tray having a central portion configured to fasten to the circuit board, a first edge which is configured to engage a first guide of the chassis, and a second edge which is configured to engage a second guide of the chassis, the metallic tray being configured to hold the circuit board within the chassis when the first edge and the second edge are engaged with the chassis.

15. A control assembly as recited in claim 14 wherein the metallic tray is configured to operate as an electromagnetic interference barrier which shields a side of the circuit board when the central portion of the metallic tray fastens to the circuit board.

16. A control assembly for controlling removal of a circuit board from a chassis, the control assembly comprising:
   a support member constructed and arranged to fasten to the circuit board;
   a handle pivotally attached to the support member so as to allow the handle to swing from an opened position to a closed position relative to the support member during installation of the circuit board within the chassis, and from the closed position to the opened position during removal of the circuit board from the chassis;
   a button operatively connected to the handle and moveable between a biased position and a depressed position relative to the support member, the button (i) inhibiting removal of the circuit board from the chassis when the support memlier is fastened to the circuit board and the button is in the biased position relative to the support member by preventing pivoting of the handle, and (ii) enabling removal of the circuit board from the chassis when the support member is fastened to the circuit board and the button is in the depressed position relative to the support member by allowing pivoting of the handle;
   a tab including an interference portion.constructed and arranged to prevent pivotal movement of the handle when the tab is in a first, locked position relative to the handle, and allowing pivotal movement of the handle in a second, unlocked position relative to the handle; and
   wherein the button is operatively connected to the tab such that the biased position of the button retains the tab in the first, locked position so as to prevent pivotal movement of the handle and wherein upon depression of the button the tab is moved into the second, unlocked position so as to allow pivotal movement of the handle.

17. A control assembly as recited in claim 16 wherein the circuit board is configured to slide into and out of the chassis along a circuit board installation axis; and wherein the button is constructed and arranged for angular rotational movement from the biased position to the depressed position by a compression force applied along a button axis which is substantially parallel to the circuit board installation axis.

18. A control assembly as recited in claim 17 wherein the tab is constructed and arranged to slide in a direction which is substantially perpendicular to the button axis between the first, locked position and the second, unlocked position.

19. A control assembly as recited in claim 18 wherein the button defines a set of ramped surfaces that are constructed and arranged to slide the tab from the first, locked position to the second, unlocked position during angular rotation of the button.

20. A control assembly as recited in claim 19 further comprising:
   a button biasing spring constructed and arranged to bias the button into the biased position and enabling movement of the button from the biased position to the depressed position in response to the compression force which overcomes an opposite spring force provided to the button by the button biasing spring.

* * * * *

UNITED STATES PATENT AND TRADEMARK OFFICE
CERTIFICATE OF CORRECTION

PATENT NO. : 7,292,456 B2 Page 1 of 1
APPLICATION NO. : 11/274024
DATED : November 6, 2007
INVENTOR(S) : Jimmy Leung et al.

It is certified that error appears in the above-identified patent and that said Letters Patent is hereby corrected as shown below:

Claim 16, Column 11, Line 24, "memlier" should read --member--.

Claim 16, Column 11, Line 32, "portion.constructed" should read --portion constructed--.

Signed and Sealed this

Eighth Day of April, 2008

JON W. DUDAS
*Director of the United States Patent and Trademark Office*